United States Patent [19]
Liaw

[11] Patent Number: 6,013,547
[45] Date of Patent: Jan. 11, 2000

[54] PROCESS FOR CREATING A BUTT CONTACT OPENING FOR A SELF-ALIGNED CONTACT STRUCTURE

[75] Inventor: Jhon-Jhy Liaw, Taipei, Taiwan

[73] Assignee: Taiwan Semiconductor Manufacturing Company, Ltd., Hsin-Chu, Taiwan

[21] Appl. No.: 09/058,121

[22] Filed: Apr. 10, 1998

[51] Int. Cl.[7] ................................................ H01L 21/8234
[52] U.S. Cl. .................... 438/238; 438/303; 438/586; 438/592; 438/629; 438/637; 438/666; 438/675; 438/238
[58] Field of Search ..................................... 438/637, 629, 438/675, 666, 668, 586, 587, 592, 303, 299, 238

[56] References Cited

U.S. PATENT DOCUMENTS

| | | | |
|---|---|---|---|
| 5,275,963 | 1/1994 | Cederbaum et al. | 438/629 |
| 5,286,674 | 2/1994 | Roth et al. | 438/639 |
| 5,451,543 | 9/1995 | Woo et al. | 438/637 |
| 5,459,354 | 10/1995 | Hara | 257/754 |
| 5,480,837 | 1/1996 | Liaw et al. | 438/649 |
| 5,646,063 | 7/1997 | Mehta et al. | 438/425 |
| 5,702,981 | 12/1997 | Maniar et al. | 438/639 |
| 5,718,800 | 2/1998 | Juengling | 156/643.1 |
| 5,792,684 | 8/1998 | Lee et al. | 438/238 |
| 5,807,779 | 9/1998 | Liaw | 438/279 |
| 5,872,056 | 2/1999 | Manning | 438/637 |
| 5,907,781 | 5/1999 | Chen et al. | 438/303 |

*Primary Examiner*—John F. Niebling
*Assistant Examiner*—Lynne A. Gurley
*Attorney, Agent, or Firm*—George O. Saile; Stephen B. Ackerman

[57] ABSTRACT

A method for fabricating a memory device, using a butt contact opening, and an overlying SAC structure, to allow connection between a gate structure, and an active device region, in a semiconductor substrate, has been developed. This invention features the use of an organic layer, protecting regions of the memory device from an dry etch procedure, that is used to remove insulator from the top surface, of a portion of the gate structure. A SAC structure, in a SAC opening, supplies the desired connection, via contact to both an active device region, and to the portion of gate structure, that is without the capping insulator.

24 Claims, 6 Drawing Sheets

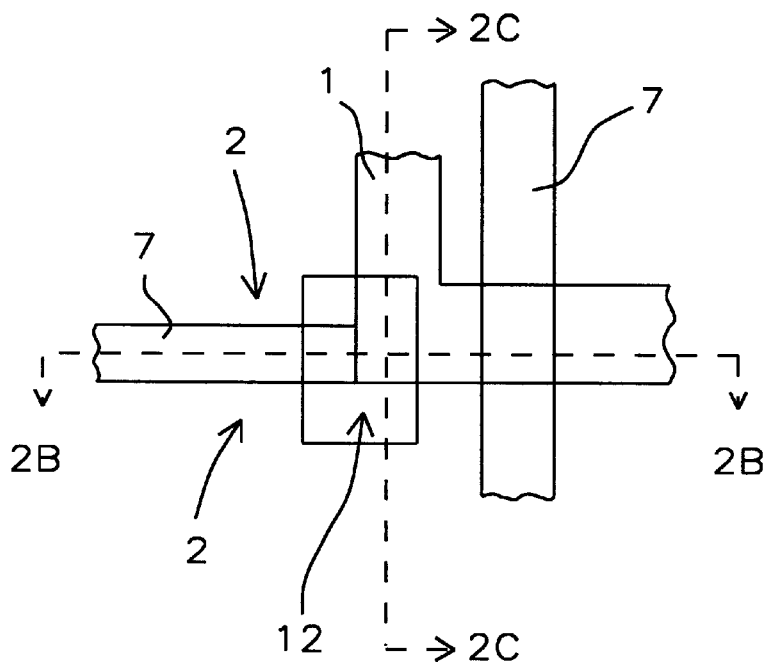
FIG. 2A
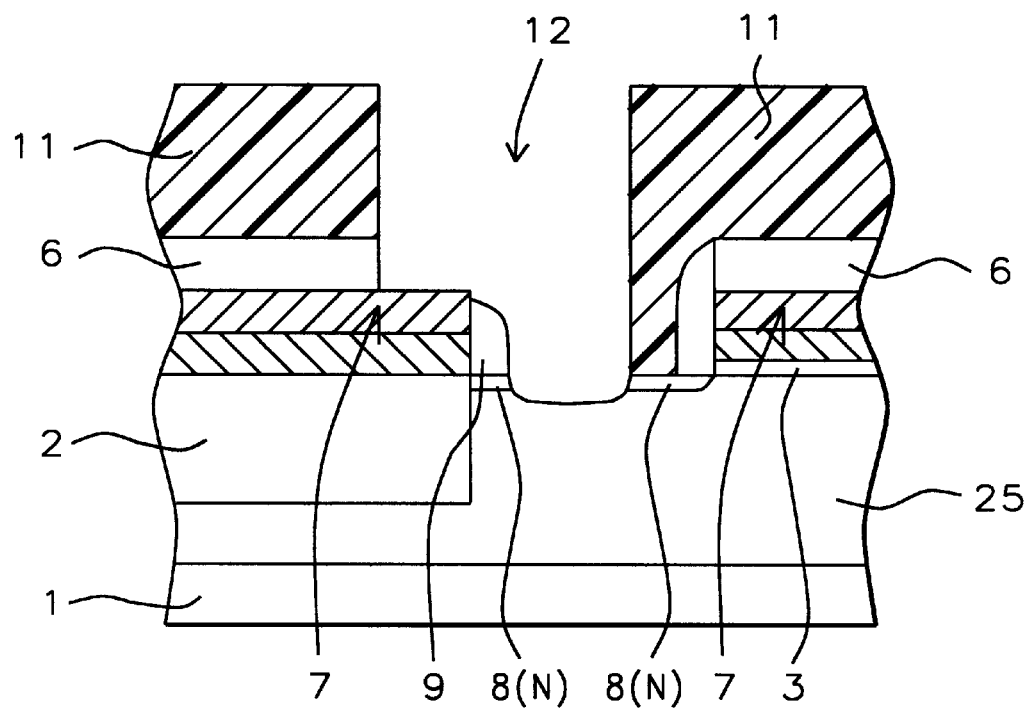
FIG. 2B – Prior Art

FIG. 2C – Prior Art

PROCESS FOR CREATING A BUTT CONTACT OPENING FOR A SELF-ALIGNED CONTACT STRUCTURE

BACKGROUND OF THE INVENTION

(1) Field of the Invention

The present invention relates to a fabrication process used to create semiconductor devices, and more specifically to a process used to form a butted contact, used to connect a gate structure, to an active device region of a memory device.

(2) Description of Prior Art

The butted contact concept, connecting a gate structure to an active device region, has been used in semiconductor memory devices, to increase device density by reducing the amount of area needed for contact purposes. The use of the butted contact, in SRAM designs, incorporate the butted contact, opened to a region overlying a insulator passivated gate structure, and an active device region, such as the source and drain region of SRAM transfer gate transistors. Therefore to complete the opening of the butted contact hole, a region of the insulator, overlying the gate structure, has to be removed. The removal of this insulator, on the underlying gate structure, now exposing an unpassivated region, or an extension of, the gate structure, can also result in unwanted gouging of adjacent isolation regions, such as insulator filled, shallow trenches, (STI). The gouging, or removal of insulator from STI regions, can result in unwanted exposure of specific regions of the semiconductor substrate, and when subsequently overlaid with contact metallization, can result in a deleterious leakage or shorting phenomena.

This invention will describe a novel process for forming a butted contact, allowing the desired simultaneous connection between a gate structure, and an active device region, however without the vulnerability of exposing unwanted semiconductor surfaces. An organic layer, such as polyimides, or layers used as bottom anti-reflective coatings, (BARC), is applied prior to applying an overlying photoresist layer. The BARC layer, or organic layer, thicker in the spaces between gate structures, than in regions overlying the gate structures, allow the removal of insulator from the gate structure, while still protecting active device regions between gate structures, during the reactive ion etch, (RIE), butt contact opening. In addition the RIE selectivity between the insulator layer, being removed from the top surface of the gate structure, and the organic layer, or the faster removal rate of insulator layer compared to organic layer, offers additional insurance against unwanted attack of semiconductor regions. Prior art, such as Hsue et al, in U.S. Pat. No. 5,521,113, show a process used to create a butted contact, however the use of an organic layer, used in this invention, to protect semiconductor regions, from unwanted exposure to the butt contact opening procedure, is not shown in that prior art.

SUMMARY OF THE INVENTION

It is an object of this invention to use a butt contact opening to allow connection between a gate structure and a specific active device region, in a semiconductor substrate.

It is another object of this invention to use an organic layer, such as a polyimide, or a BARC layer, to protect other active device regions from exposure to the butt contact opening procedure.

It is still another object of this invention to use a RIE process for butt contact opening, using a RIE chemistry that removes insulator layer, from the top surface of a gate structure, at a faster etch rate than the etch rate of the protecting BARC, or polyimide layer.

In accordance with the present invention a process for creating a butt contact opening, allowing simultaneous metal contact to be achieved between an unpassivated, top surface of a gate structure, and an active device region, has been developed. After definition of polycide gate structures, capped with an insulator layer, lightly doped source and drain regions are formed in regions of the semiconductor substrate, not covered by the polycide gate structures, or by isolation regions. After forming insulator spacers, on the sides of the polycide gate structures, a non-photosensitive organic layer, such as a polyimide, or BARC layer, is applied, resulting in a thick BARC fill between polycide gate structures, while a thinner BARC layer coats the top surface of the polycide gate structures. A photolithographic procedure is used to create the butt contact opening in a photoresist layer, exposing a region of thin BARC on a polycide gate structure, and a thicker BARC layer, overlying active device regions, between polycide gate structures, and overlying insulator filled shallow trench, isolation regions. A RIE procedure is used to remove the thin BARC layer, exposing a region of an insulator capped, polycide gate structure, while still leaving protective BARC layer in the spaces between polycide gate structures, as well as on isolation regions. A selective RIE procedure is than used to remove exposed insulator from the top surface of the polycide gate structure, while other regions are still protected by the thicker, and slower etching BARC layer. After removal of photoresist, heavily doped source and drain regions are created. Deposition of interlevel insulator layers is followed by a self-aligned contact opening, allowing exposure of an active device region, and an unpassivated, top surface of a polycide gate structure. Subsequent metallization and patterning allow the desired connection between a polycide gate structure, and an active device region, to be realized.

BRIEF DESCRIPTION OF THE DRAWINGS

The object and other advantages of this invention are best described in the preferred embodiment with reference to the attached drawings that include:

FIGS. 1A, 2A, which schematically illustrate top views of key fabrication stages, used to create the butt contact opening, for a memory device.

FIGS. 1B, 2B, 2C, which schematically, in cross-sectional style, show prior art, at key stages of the butt contact opening procedure.

DESCRIPTION OF THE PREFERRED EMBODIMENTS

The process for creating a butt contact opening, allowing electrical connection between a gate structure, and a semiconductor active device region, to be achieved via a subsequent metal filled, self-aligned contact, (SAC), structure, will now be described in detail. The butt contact opening, described in this invention, can be used for SRAM designs, comprised of complimentary MOSFET devices, (N channel as well as P channel devices). However the butt contact opening of this invention, can be used for designs other than SRAM. In addition, although this invention describes the butt contact opening, applied to N channel metal oxide semiconductor field effect transistor, (MOSFET), devices, it can also be applied to P channel devices.

Figure 1A:
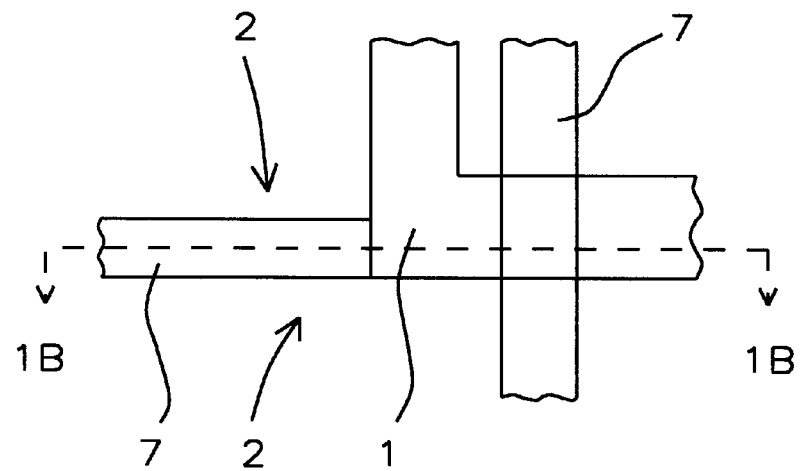

FIG. 1A, schematically shows the top view of a region of a MOSFET device, prior to butt contact opening. An active device region, in semiconductor substrate 1, is shown surrounded by isolation regions, insulator filled, shallow trenches 2. Polycide gate structures 7, are also illustrated in FIG. 1A.

Figure 1B:
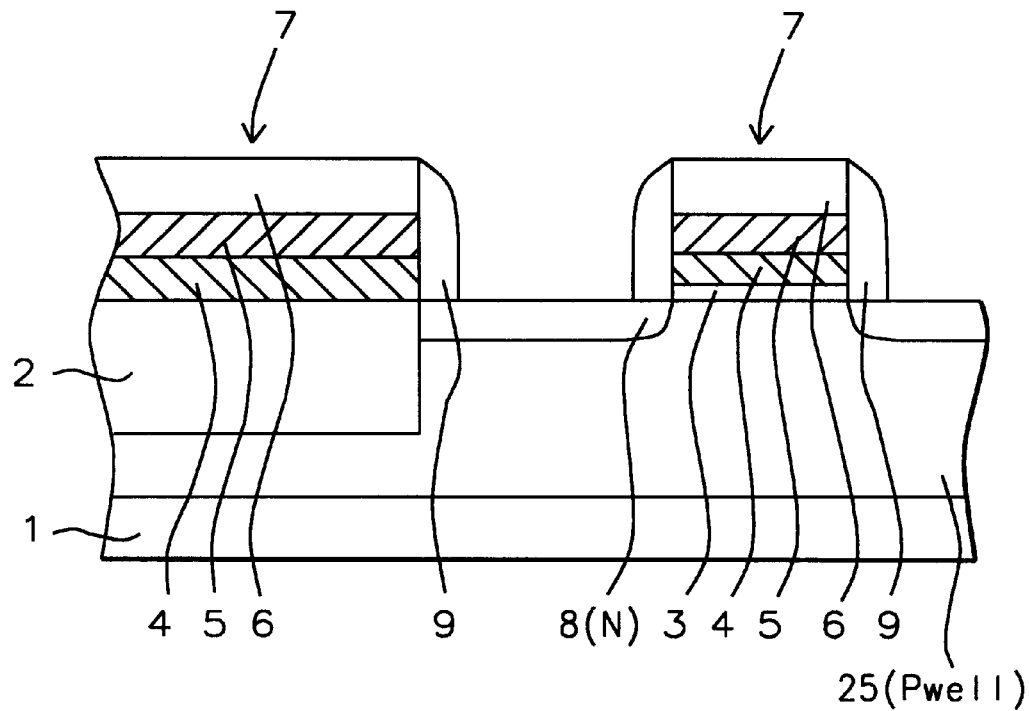
Figure 3:
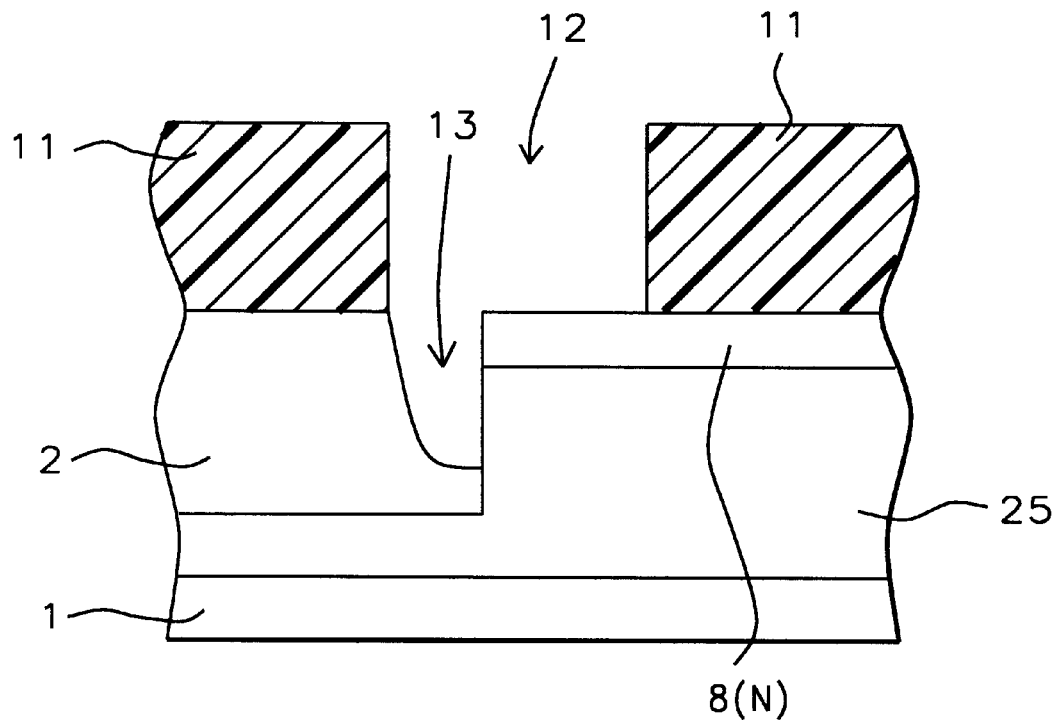
FIGS. 3–8, which schematically, in cross-sectional style, show key stages of butt contact fabrication, featured in this invention.
Figure 3:
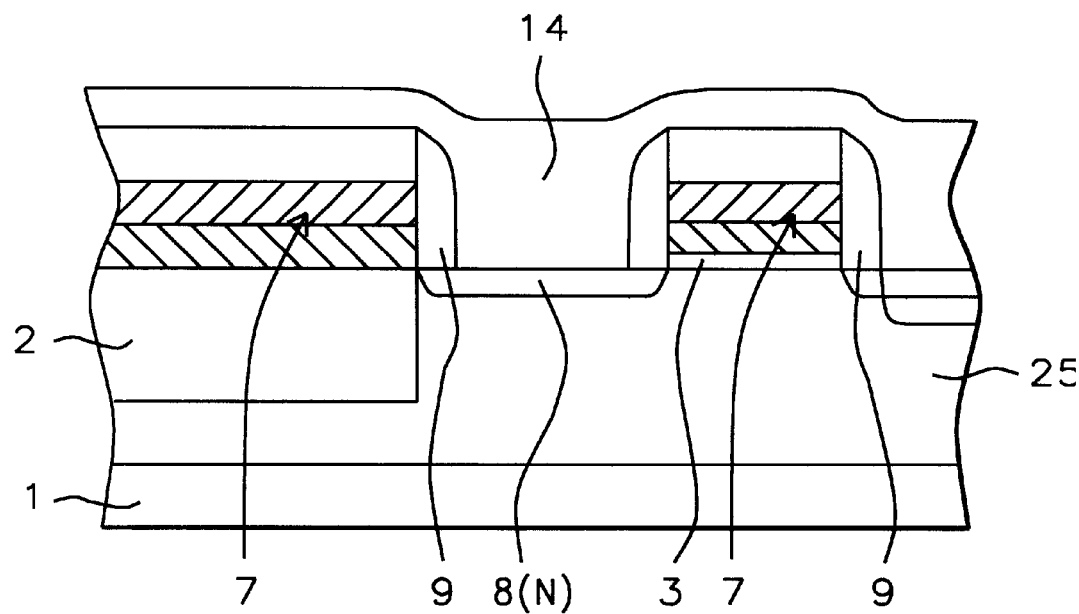

FIG. 1B, schematically, in cross-sectional style, shows a MOSFET device at a fabrication stage, prior to butt contact opening. A P type, single crystalline, silicon substrate 1, with a <100> crystallographic orientation, is used, and shown schematically in FIG. 1A. P well region 25, is created via ion implantation of boron, followed by an anneal procedure, resulting the formation of P well region 25, featuring a higher P type doping level, than semiconductor substrate 1. Insulator filled, shallow trenches 2, are next formed for purposes of isolation. Briefly, a shallow trench is defined in an overlying masking insulator layer, (not shown in FIG. 1B), and semiconductor substrate 1, via photolithographic and anisotropic RIE procedures, using $CHF_3$ as an etchant for the masking insulator layer, while using $Cl_2$ as an etchant for semiconductor substrate 1. The depth of the shallow trench, in semiconductor substrate 1, is between about 3000 to 7000 Angstroms. A deposition of a silicon oxide layer, via low pressure chemical vapor deposition, (LPCVD), or plasma enhanced chemical vapor deposition, (PECVD), procedures, using tetraethylorthosilicate, (TEOS), as a source, is performed to a thickness between about 4000 to 8000 Angstroms, completely filling the shallow trench in semiconductor substrate 1. Unwanted regions of the silicon oxide layer are than removed using either a chemical mechanical polishing, (CMP), procedure, or via a selective RIE procedure, using $CHF_3$ as an etchant, resulting in insulator filled, shallow trench 2, shown schematically in FIG. 1B. The masking insulator layer, used for definition of the shallow trench, is also removed during the CMP or RIE procedure.

A thin gate, silicon dioxide layer 3, is next thermally grown, in an oxygen steam ambient, at a temperature between about 800 to 1000° C., to a thickness between about 30 to 150 Angstroms. A polysilicon layer 4, is deposited using LPCVD procedures, at a temperature between about 500 to 700° C., to a thickness between about 500 to 2500 Angstroms. Polysilicon layer 4, can be in situ doped during deposition, via the addition of phosphine, or arsine, to a silane ambient, or polysilicon layer 4, can be deposited intrinsically and doped via an ion implantation procedure, using arsenic or phosphorous ions. A metal silicide layer 5, such as tungsten silicide, is next deposited, via LPCVD procedures, to a thickness between about 500 to 2000 Angstroms. A silicon oxide layer 6, is next deposited using either LPCVD or PECVD procedures, at a temperature between about 350 to 750° C., to a thickness between about 1000 to 3000 Angstroms, using tetraethylorthosilicate, (TEOS), as a source.

Conventional photolithographic and reactive ion etching, (RIE), procedures, using $CHF_3$ as an etchant for first silicon oxide layer 6, while using $Cl_2$ as an etchant for metal silicide layer 5, and for polysilicon layer 4, are performed, creating silicon oxide capped, polycide, (metal silicide—polysilicon), gate structures 7, shown schematically in FIG. 1B. Polycide gate structures are used to reduce the resistance of the gate structures, however if specific designs do not need the lower resistance offered by polycide layers, the use of a metal silicide layer, as part of the gate structure, can be eliminated, and a polysilicon gate structure, comprised of polysilicon, at a thickness between about 500 to 2000 Angstroms, can be used. After removal of the photoresist layer, used as a mask for gate structure patterning, via plasma oxygen ashing and careful wet cleans, a lightly doped, N type source and drain region 8, is created via ion implantation of phosphorous or arsenic, at an energy between about 25 to 75 KeV, at a dose between about 5E11 to 5E13 atoms/cm². Another silicon oxide layer is deposited, again via use of either LPCVD or PECVD procedures, at a temperature between about 350 to 750° C., to a thickness between about 1500 to 4000 Angstroms, using TEOS as a source, followed, by an anisotropic RIE procedure, using $CHF_3$ as an etchant, to create insulator spacers 9. Insulator spacers 9, can also be comprised of silicon nitride. The result of these procedures is schematically shown in FIG. 1B.

FIG. 2A, schematically shows the desired location of butt contact opening 12, using a top view, while FIGS. 2B and 2C, schematically show cross-sectional views of the result of a butt contact opening procedure, previously used, without the benefit of this invention, resulting in unwanted silicon damage, and unwanted gouging of insulator, in insulator filled, shallow trench 2. The objective of the butt contact opening is the removal of silicon oxide 6, from a top portion of a polycide gate structure, subsequently allowing a metal structure to simultaneously contact both a polycide gate structure and an active device region, in the semiconductor substrate. FIG. 2B, shows prior art, and a cross-sectional view, in one direction of a butt contact opening, resulting in the removal of insulator 6, from the surface of polycide gate structure 7. A photoresist shape 11, is used as a mask to allow removal of silicon oxide layer 6, exposed in butt contact opening 12, to be accomplished via a RIE procedure using $CHF_3$. The result of this procedure, in addition to removing exposed silicon oxide layer 6, from the top surface of polycide gate structure 7, is the undesired attack of the exposed region of lightly doped source and drain region 8. This phenomena can occur during the butt contact opening, over etch cycle, performed using a RIE etchant that does not exhibit infinite etch rate selectivity between silicon oxide and silicon. FIG. 2C, schematically illustrates a cross-sectional view of the butt contact opening, in a direction normal to the direction shown in FIG. 2A. In this case the insulator, in the insulator filled, shallow trench 2, has been exposed to the entire RIE butt contact opening procedure, resulting in the undesired removal, or gouging, of insulator from the insulator filled, shallow trench 2, and resulting in exposure of P well region 25, in region 13, schematically shown in FIG. 2C. A subsequent metal contact structure will therefore result in leakage or gate to substrate shorting, between the polycide gate structure 7, and P well region 25.

Figure 4:
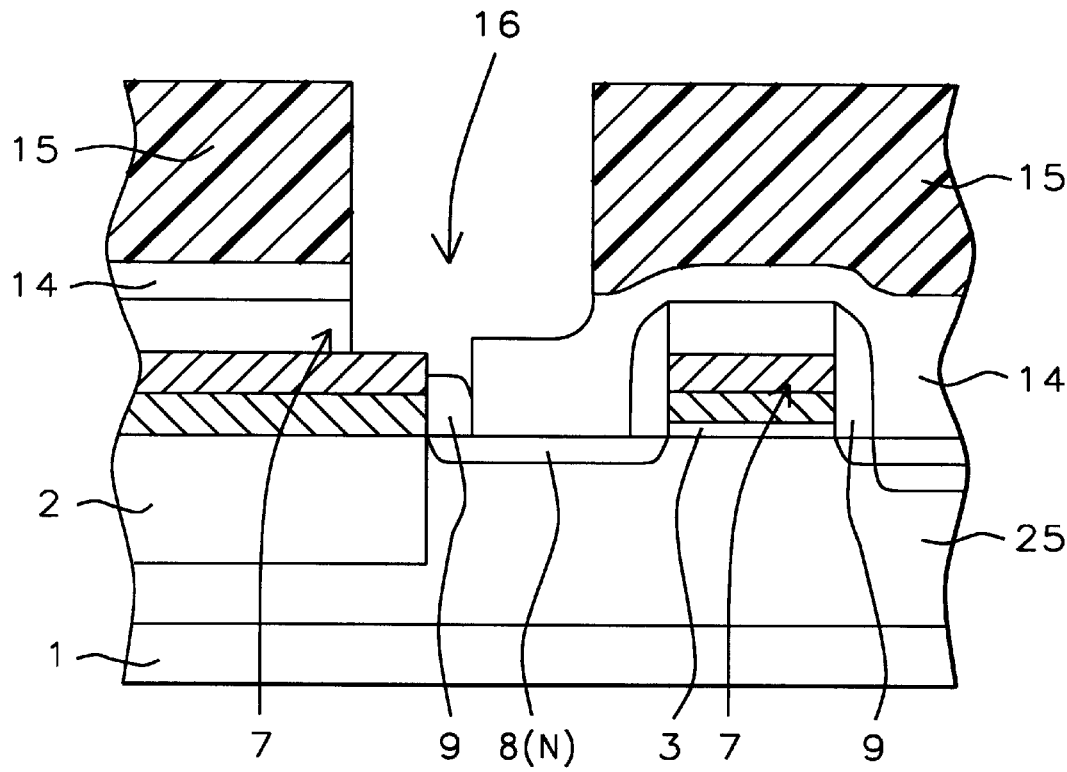
Figure 5:
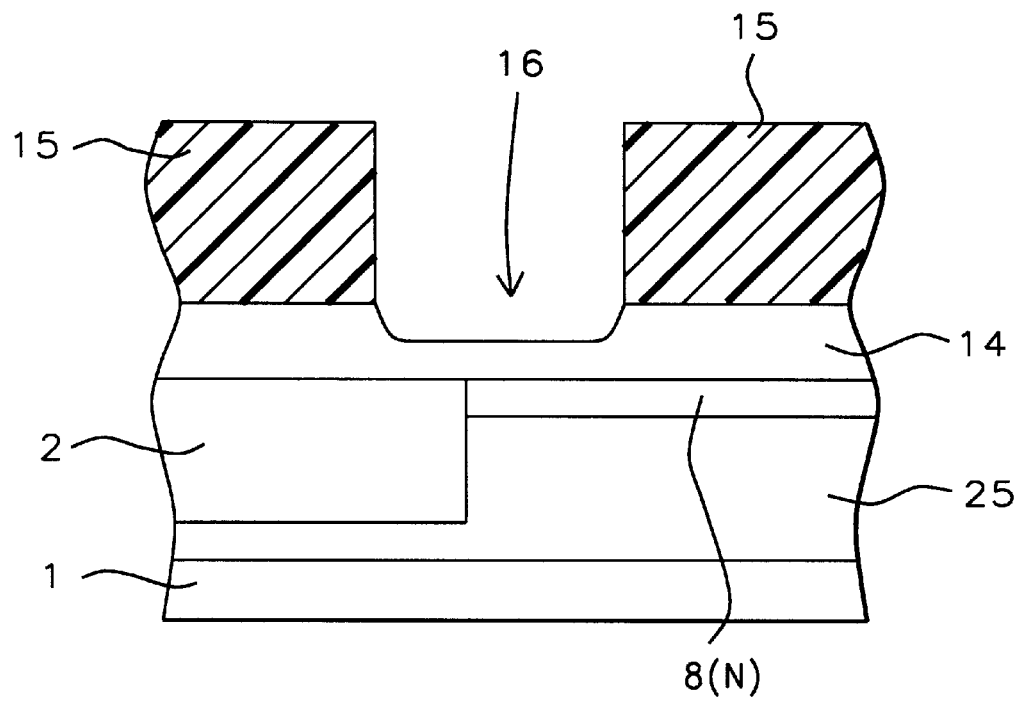
Figure 6:
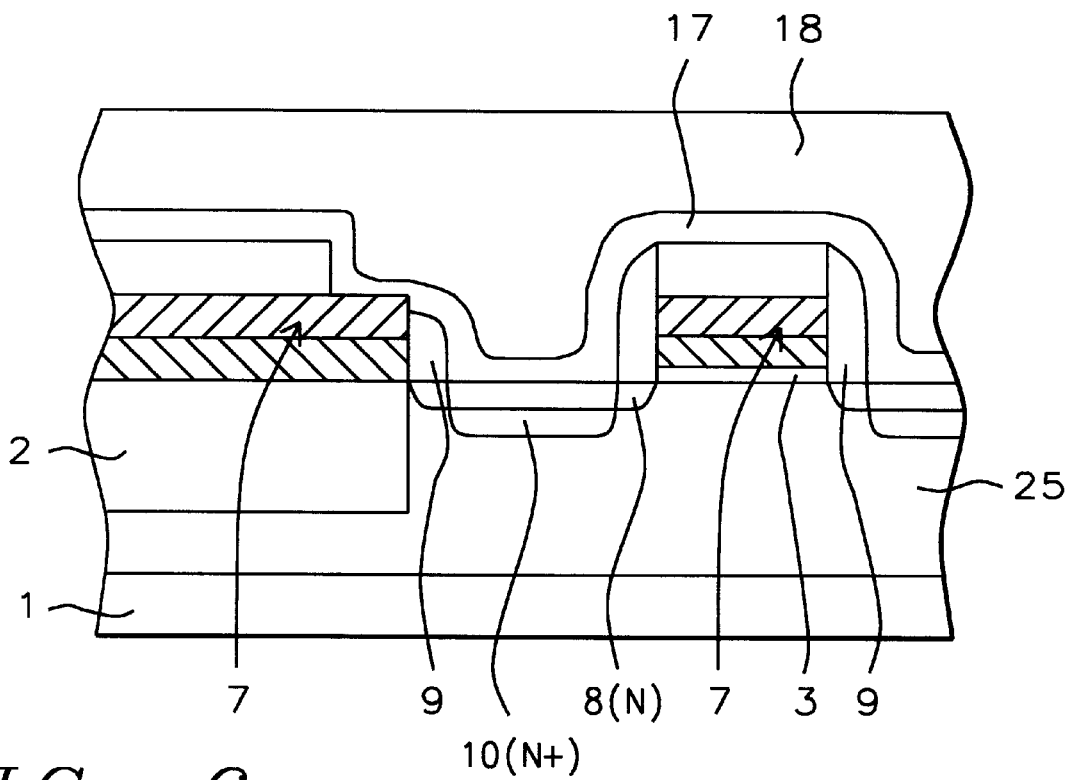
Figure 7:
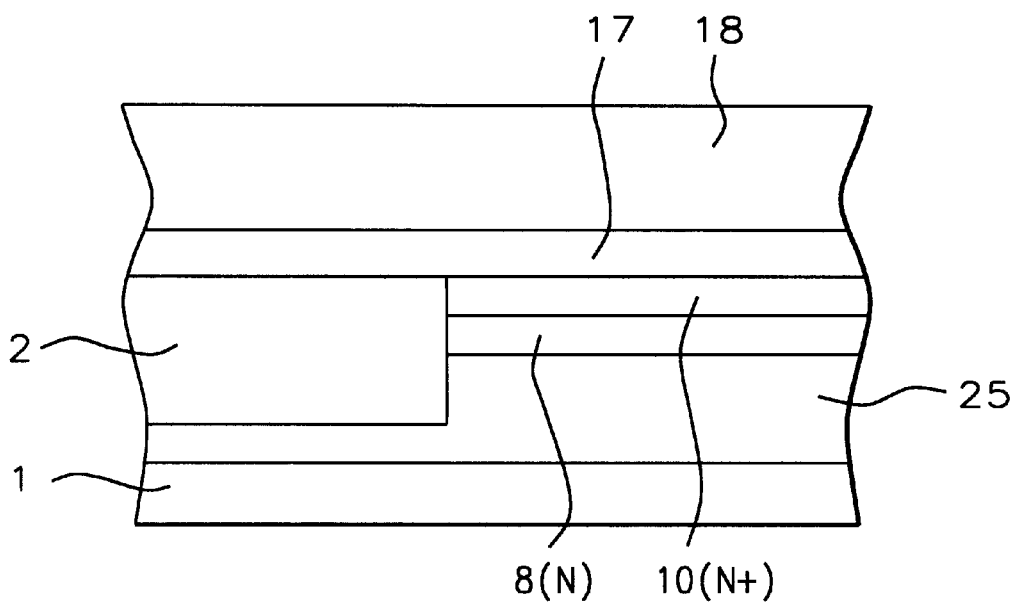

The procedure to create a butt contact structure, eliminating the unwanted insulator gouging, and silicon attack, thus avoiding gate to substrate leakage or shorts, will now be described using FIGS. 3–8. An organic layer 14, such as a non-photosensitive polyimide layer, or an organic BARC layer, (bottom anti-reflective coating), is applied, resulting in a degree of planarization, completely filling the spaces between polycide gate structures 7, with a thick organic coating, between about 600 to 1500 Angstroms, while resulting in a thinner organic coating, between about 50 to 300 Angstroms, overlying these same polycide gate structures. This is shown schematically in FIG. 3. A butt contact image 16, is next formed in photoresist layer 15. An anisotropic RIE procedure, using $CF_4$ and $CHF_3$ as etchants, are used to remove exposed, thin organic layer 14, from the top surface of silicon oxide layer 6, followed by the removal of exposed silicon oxide layer 6, from the top surface of polycide gate structure 7, using a $CF_4$, $N_2$, argon, etching chemistry. This is schematically shown in FIG. 4. The thicker layer of organic coating, remaining between polycide gate structures 7, prevented attack of lightly doped source and drain region 8, during the opening of the butt contact. FIG. 5, schematically shows the cross-sectional view, at a direction normal to the direction shown in FIG. 4. The thick organic coating 14, prevented attack of the insulator in insulator filled, shallow trench 2, thus avoiding the gouging, or unwanted removal of insulator, observed in FIG. 2C. The etch rate selectivity of silicon oxide to organic, using the $CF_4$, $N_2$, argon, RIE chemistry, is between about 1.5 to 3.0 to one, allowing the silicon oxide to be removed at a faster rate than the protecting organic layer, thus the unwanted exposure of P well region 25, does not occur during the butt contact opening procedure.

After removal of photoresist layer 15, and organic coating 14, via plasma oxygen ashing and careful wet cleans, heavily doped source and drain regions 10, are created via an ion implantation procedure, using either arsenic or phosphorous, at an energy between about 30 to 100 KeV, at a dose between about 1E14 to 1E16 atoms/cm$^2$. This region is shown schematically in FIG. 6. A silicon nitride layer 17, is next deposited, via LPCVD or PECVD procedures, to a thickness between about 300 to 600 Angstroms, followed by the deposition of a composite insulator layer 18. Composite insulator layer 18, is comprised of an underlying layer of silicon oxide, deposited using PECVD procedures, using TEOS as a source, to a thickness between about 1000 to 2000 Angstroms. Composite insulator layer 18, is also comprised of an overlying layer of BPSG, (borophosphosilicate glass), again deposited using PECVD procedures, to a thickness between about 3000 to 12000 Angstroms, using TEOS as a source, and adding phosphine and diborane to the ambient to create the BPSG overlying insulator layer. A reflow procedure, performed at a temperature between about 750 to 900° C., is employed to create a smooth top surface topology. The result of these procedures are schematically shown, cross-sectionally for one direction, in FIG. 6, and cross-sectionally in FIG. 7, using a direction normal to the direction previously shown in FIG. 6.

Figure 8:
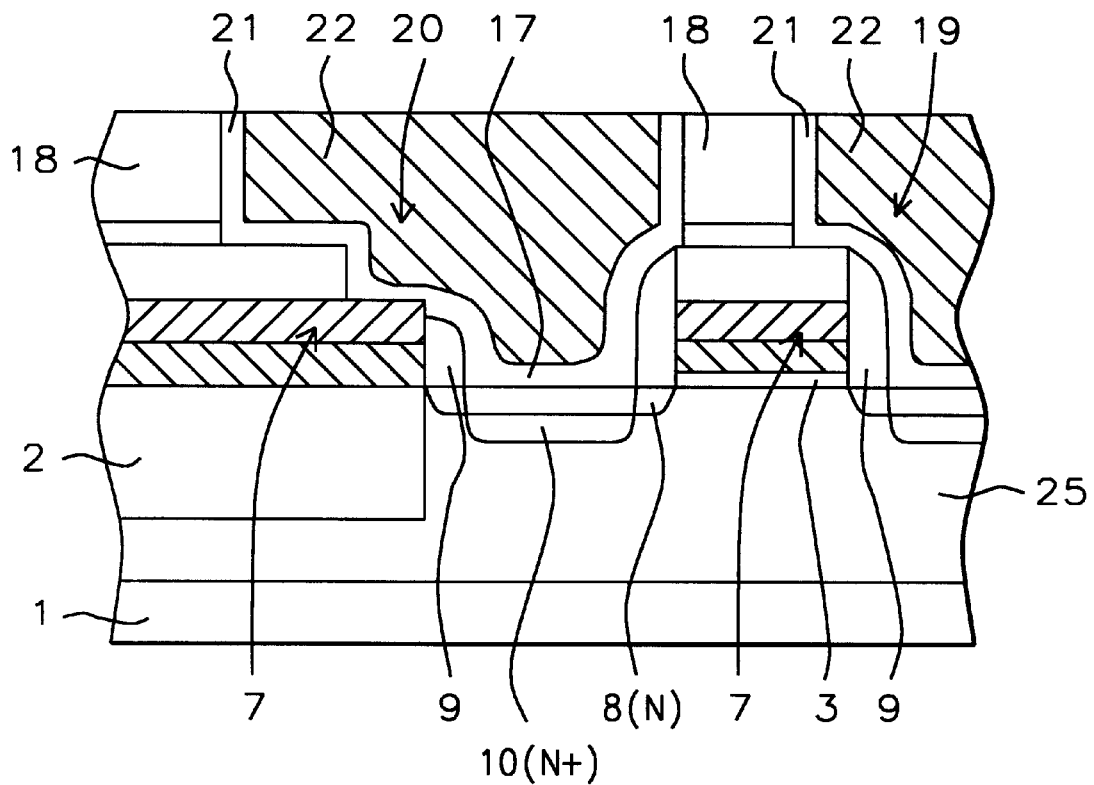

FIG. 8. schematically shows a self-aligned contact, (SAC), metal structure, connecting polycide gate structure 7, to the active device regions, comprised of heavily doped source and drain region 10. Photolithographic and RIE procedures, using $CHF_3$ as an etchant for composite insulator layer 18, is used to open SAC hole 19, and SAC hole 20, in composite insulator layer 18. This RIE procedure, allowing the removal of insulator layer 18, at a faster rate than removal of silicon nitride layer 17, allows the complete removal of insulator layer 18, without attack of active device regions protected with silicon nitride. The RIE chemistry is then changed to $CF_4$ and $CHF_3$, allowing exposed regions of silicon nitride to be removed exposing a heavily doped source and drain region, in SAC hole 19, while exposing heavily doped source and drain region 10, and a top portion of polycide gate structure 7, that had previously experienced silicon oxide removal using the butt contact opening procedure, in SAC hole 20. After removal of the photoresist layer, used as a mask for SAC hole definition, via plasma oxygen ashing and careful wet cleans, contact plugs are formed in the SAC holes. First a composite metal layer 21, is deposited via R.F. sputtering, comprised of an underlying adhesive and contact layer of titanium, at a thickness between about 200 to 400 Angstroms, and comprised of an overlying titanium nitride layer, at a thickness between about 600 to 1500 Angstroms, used as a barrier layer to protect underlying materials from the reactants, and reaction products, of a subsequent tungsten deposition. A tungsten layer 22, is next deposited, using LPCVD procedures, to a thickness between about 3000 to 7000 Angstroms, at a temperature between about 400 to 500° C., completely filling SAC hole 19, and SAC hole 20. Removal of unwanted metal is accomplished using either a CMP procedure, or via an anisotropic RIE procedure, using $Cl_2$ as an etchant, resulting in a SAC metal structure, in SAC hole 19, an another SAC metal structure, in SAC hole 20, resulting in the connection of the region of polycide gate structure 7, opened with the butt contact opening procedure, to an active device region.

While this invention has been particularly shown and described with reference to, the preferred embodiments thereof, it will be understood by those skilled in the art that various changes in form and details may be made without departing from the spirit and scope of this invention.

What is claimed is:

1. A method for fabricating a memory device, on a semiconductor substrate, using a self-aligned contact structure for connection between a gate structure and an active device region, in the semiconductor substrate, comprising the steps of:

providing an insulator filled, shallow trench isolation region, in said semiconductor substrate;

providing transfer gate transistors, comprised of insulator capped, gate structures, on a thin gate insulator layer, with insulator spacers on the sides of said insulator capped, gate structures, and with a lightly doped source and drain region, in a region of said semiconductor substrate not covered by said insulator capped, gate structures;

applying an organic coating, comprised of a thick organic coating between said gate structures, and a thin organic coating on the top surface of said insulator capped, gate structures;

forming a photoresist shape, with a butt contact opening, in said photoresist shape, exposing a portion of said thin organic coating, overlying a portion of the top surface of a insulator capped, gate structure, and exposing a portion of said thick organic coating, overlying an active device region, between said insulator capped, gate structures;

removing said thin organic coating, from the top surface of an insulator capped, gate structure, exposed in said butt contact opening, in said photoresist shape;

removing insulator, from the top surface of the portion of said insulator capped, gate structure exposed in said butt contact opening, in said photoresist shape, creating a portion of an uncapped, gate structure;

removing said photoresist shape, said thin organic coating, and said thick organic coating;

forming heavily doped source and drain regions in a region of said semiconductor substrate, not covered by said insulator capped, gate structures, and not covered by said insulator spacers, on the sides of said insulator capped, gate structures;

forming a SAC opening in a composite insulator layer, and in an underlying silicon nitride layer, exposing said portion of uncapped, gate structure, and exposing a portion of said active device region; and forming a metal SAC structure, in said SAC opening, resulting in a connection between a gate structure, and an active device region, in said semiconductor substrate.

2. The method of claim 1, wherein said insulator capped, gate structures, are polycide gate structures, comprised of a tungsten silicide layer, obtained via LPCVD procedures, at a thickness between about 500 to 2000 Angstroms, and an underlying polysilicon layer, obtained via LPCVD procedures, at a thickness between about 500 to 2000 Angstroms.

3. The method of claim 1, wherein said insulator capped, gate structures, are polysilicon gate structures, comprised of a polysilicon layer, obtained via LPCVD procedures, at a thickness between about 500 to 2000 Angstroms.

4. The method of claim 1, wherein said insulator, of said insulator capped, gate structures, is a silicon oxide layer, deposited using LPCVD or PECVD procedures, to a thickness between about 1000 to 3000 Angstroms.

5. The method of claim 1, wherein said organic coating is a non-photosensitive polyimide layer.

6. The method of claim 1, wherein said organic coating is an organic, bottom anti-reflective coating, (BARC).

7. The method of claim 1, wherein removal of said thin organic coating, from the top surface of said insulator capped, gate structures, is performed using a RIE procedure, using an $CF_4$ and $CHF_3$, etch chemistry.

8. The method of claim 1, wherein removal of said insulator, from the top surface of a portion of said insulator capped, gate structures, is accomplished using a RIE procedure, using a $CF_4$, $N_2$, argon, etch chemistry, with an etch ratio of insulator layer to organic layer, between about 1.5 to 3.0, to 1.

9. The method of claim 1, wherein said silicon nitride layer is deposited using LPCVD or PECVD procedures, to a thickness between about 300 to 600 Angstroms.

10. The method of claim 1, wherein said composite insulator layer is comprised of an underlying silicon oxide layer, deposited to a thickness between about 1000 to 2000 Angstroms, via PECVD procedures, using TEOS as a source, and comprised of an overlying boro-phosphosilicate layer, deposited using PECVD procedures, and TEOS as a source, to a thickness between about 3000 to 12000 Angstroms.

11. The method of claim 1, wherein said metal SAC structure is formed from a composite metal layer, coating the sides of said SAC opening, comprised of an underlying titanium layer, deposited via R.F. sputtering, to a thickness between about 200 to 400 Angstroms, and an overlying, titanium nitride layer, deposited using R.F. sputtering, to a thickness between about 600 to 1500 Angstroms, and formed from a tungsten plug, filling said SAC opening, with said tungsten plug formed from a tungsten layer, obtained via LPCVD deposition, to a thickness between about 3000 to 7000 Angstroms.

12. A method for fabricating a memory device, on a semiconductor substrate, using a butt contact opening, as part of a self-aligned contact, (SAC), process, to connect a gate structure to an active device region, in said semiconductor substrate, comprising the steps of:

providing insulator filled shallow trench, isolation regions, in said semiconductor substrate;

providing transfer gate transistors, comprised of silicon oxide capped, polycide gate structures, on a gate insulator layer, with insulator spacers on the sides of said silicon oxide capped, polycide gate structures, and with source and drain regions in said a region of said semiconductor substrate, not covered by said silicon oxide capped, polycide gate structures;

applying a bottom anti-reflective coating, (BARC), resulting in a thin BARC layer on said silicon oxide capped, polycide gate structures, and resulting in a thick BARC layer, on said insulator filled shallow trench, and on regions of said semiconductor substrate, not covered by silicon oxide capped, polycide gate structures;

forming a butt contact opening in a photoresist layer, exposing a region of said thin BARC layer, overlying a silicon oxide capped, polycide gate structure;

performing a first dry etch procedure, removing said thin BARC layer, from a region overlying a silicon oxide capped, polycide gate structure, in said butt contact opening;

performing a second dry etch procedure, removing silicon oxide, from said silicon oxide capped, polycide gate structure, exposed in said butt contact opening, resulting in a portion of said silicon oxide capped, polycide gate structure, without an overlying silicon oxide layer;

removing said photoresist layer, said thick BARC layer, and said thin BARC layer;

forming heavily doped source and drain regions in a region of said semiconductor substrate not covered by said silicon oxide capped, polycide gate structures, and not covered by said insulator spacers, on the sides of said silicon oxide capped, polycide gate structures;

depositing a silicon nitride layer;

depositing a composite insulator layer;

forming a SAC opening in said composite insulator layer, and in said silicon nitride layer, exposing said silicon oxide capped, polycide gate structure, including exposure of the region of said silicon oxide capped, polycide gate structure, without the silicon oxide layer, and exposing an area of said heavily doped source and drain region;

depositing a titanium layer on the top surface of said composite insulator layer, and on exposed surfaces of said SAC opening;

depositing a titanium nitride layer, on said titanium layer;

depositing a tungsten layer, on said titanium nitride layer, completely filling said SAC opening; and forming a tungsten plug, in said SAC opening, by removing regions of said tungsten layer, said titanium nitride layer, and said titanium layer, from the top surface of said composite insulator layer.

13. The method of claim 12, wherein silicon oxide capped, polycide gate structures, are comprised of an overlying tungsten silicide layer, obtained via LPCVD procedures, at a thickness between about 500 to 2000 Angstroms, and an underlying polysilicon layer, obtained via LPCVD procedures, at a thickness between about 500 to 2000 Angstroms.

14. The method of claim 12, wherein said silicon oxide layer, used for said silicon oxide capped, polycide gate structures, is obtained via an LPCVD or a PECVD procedure, to a thickness between about 1000 to 3000 Angstroms.

15. The method of claim 12, wherein the thickness of said thin BARC layer is between about 50 to 300 Angstroms.

16. The method of claim 12, wherein the thickness of said thick BARC layer is between about 600 to 1500 Angstroms.

17. The method of claim 12, wherein said first dry etch procedure, used to remove said thin BARC layer from the top surface, of a region of said silicon oxide capped, polycide gate structure, exposed in said butt contact opening, is performed via a RIE procedure, using $CF_4$ and $CHF_3$ as etchants.

18. The method of claim 12, wherein said second dry etch procedure, used to remove said silicon oxide, from said silicon oxide capped, polycide gate structure, exposed in said butt contact opening, is performed via a RIE procedure, using a $CF_4$, $N_2$, argon, etch chemistry, with an etch rate ratio of silicon oxide to BARC, between about 1.5 to 3.0, to 1.

19. The method of claim 12, wherein said silicon nitride layer is deposited to a thickness between about 300 to 600 Angstroms, via an LPCVD, or a PECVD procedure.

20. The method of claim 12, wherein said composite insulator layer is comprised of an underlying silicon oxide layer, deposited using PECVD procedures, using TEOS as a source, to a thickness between about 1000 to 2000 Angstroms, and comprised of an overlying borophosphosilicate layer, deposited using PECVD procedures, using TEOS as a source, to a thickness between about 3000 to 12000 Angstroms.

21. The method of claim 12, wherein said SAC opening, in said composite insulator layer, and in said silicon nitride layer, is formed via an anisotropic RIE procedure, using $CHF_3$ as an etchant for said composite insulator layer, and using $CF_4$ and $CHF_3$ as etchants for said silicon nitride layer.

22. The method of claim 12, wherein said titanium layer is deposited using R.F. sputtering, to a thickness between about 200 to 400 Angstroms.

23. The method of claim 12, wherein said titanium nitride layer is deposited using R.F. sputtering to a thickness between about 600 to 1500 Angstroms.

24. The method of claim 12, wherein said tungsten layer is deposited using LPCVD procedures, at a temperature between about 400 to 500° C., to a thickness between about 3000 to 7000 Angstroms.

* * * * *